(12) United States Patent
Sarrach et al.

(10) Patent No.: US 10,509,291 B2
(45) Date of Patent: Dec. 17, 2019

(54) ELECTRICAL DEVICE INCLUDING A SUBSTRATE AND A TRANSPARENT CONDUCTIVE LAYER AND A PROCESS OF FORMING THE SAME

(71) Applicant: SAGE ELECTROCHROMICS, INC., Faribault, MN (US)

(72) Inventors: Sebastian Marius Sarrach, Lakeville, MN (US); Florent Martin, Minneapolis, MN (US); Erik Jon Bjornard, Lakeville, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 6 days.

(21) Appl. No.: 15/905,175

(22) Filed: Feb. 26, 2018

(65) Prior Publication Data
US 2018/0252976 A1 Sep. 6, 2018

Related U.S. Application Data

(60) Provisional application No. 62/464,138, filed on Feb. 27, 2017.

(51) Int. Cl.
*G02F 1/153* (2006.01)
*G02F 1/155* (2006.01)
(Continued)

(52) U.S. Cl.
CPC ............ *G02F 1/155* (2013.01); *C23C 14/086* (2013.01); *G02F 1/153* (2013.01); *G02F 1/1523* (2013.01);
(Continued)

(58) Field of Classification Search
CPC ........ G02F 1/155; G02F 1/1523; G02F 1/153; G02F 1/1533; G02F 1/1524;
(Continued)

(56) References Cited

U.S. PATENT DOCUMENTS 4,419,386 A  12/1983  Gordon
5,239,406 A   8/1993  Lynam
(Continued)

FOREIGN PATENT DOCUMENTS

CN      1510494 A   7/2004
CN    101517473 A   8/2009
(Continued)

OTHER PUBLICATIONS

Dunsky et al., "Scribing thin-film solar panels," Industrial Laser Solutions for Manufacturing Application Report, Feb. 2008, PenWell Corporation.

(Continued)

*Primary Examiner* — William Choi
(74) *Attorney, Agent, or Firm* — Abel Schillinger, LLP; Robert N. Young

(57) ABSTRACT

A stack of layers can be formed adjacent to a substrate before any layer within the stack is patterned. In an embodiment, combinations of substrates and stacks can be made and stored for an extended period, such as more than a week or a month, or shipped to a remote location before further manufacturing occurs. By delaying irreversible patterning until the closer to the date final product will be shipped to a customer, the likelihood of having too much inventory of a particular size or having to scrap windows for a custom order that was cancelled after manufacturing started can be substantially reduced. Further, particles between layers of the stack can be avoided. The process flows described are flexible, and many of the patterning operations in forming holes, openings, or the high resistance region can be performed in many different orders.

19 Claims, 9 Drawing Sheets

(51) Int. Cl.
  *G02F 1/1523* (2019.01)
  *C23C 14/08* (2006.01)
  *G02F 1/15* (2019.01)
  *G02F 1/1524* (2019.01)

(52) U.S. Cl.
  CPC .......... *G02F 1/1533* (2013.01); *G02F 1/1508* (2013.01); *G02F 1/1524* (2019.01); *G02F 1/15245* (2019.01); *G02F 2001/1555* (2013.01)

(58) Field of Classification Search
  CPC ............... G02F 1/15245; G02F 1/1508; G02F 2001/1555; C23C 14/086
  USPC .................................................. 359/265–275
  See application file for complete search history.

(56) References Cited

U.S. PATENT DOCUMENTS

| | | | |
|---|---|---|---|
| 5,321,544 | A | 6/1994 | Parkhe et al. |
| 5,370,775 | A | 12/1994 | Parkhe |
| 5,404,244 | A | 4/1995 | Van Dine et al. |
| 5,657,149 | A | 8/1997 | Buffat et al. |
| 5,659,417 | A | 8/1997 | Van Dine et al. |
| 5,699,192 | A | 12/1997 | Van Dine et al. |
| 5,724,175 | A | 3/1998 | Hichwa et al. |
| 5,724,177 | A | 3/1998 | Ellis, Jr. et al. |
| 5,755,537 | A | 5/1998 | Lubbering |
| 5,825,526 | A | 10/1998 | Bommarito et al. |
| 6,502,423 | B1 | 1/2003 | Ostendarp et al. |
| 7,193,763 | B2 | 3/2007 | Beteille et al. |
| 7,372,610 | B2 | 5/2008 | Burdis et al. |
| 7,593,154 | B2 | 9/2009 | Burdis et al. |
| 7,710,671 | B1 | 5/2010 | Kwak et al. |
| 7,749,907 | B2 | 7/2010 | Miyairi et al. |
| 8,004,744 | B2 | 8/2011 | Burdis et al. |
| 8,035,882 | B2 | 10/2011 | Fanton et al. |
| 8,043,796 | B2 | 10/2011 | Akimoto |
| 8,148,259 | B2 | 4/2012 | Arai et al. |
| 8,391,331 | B2 | 3/2013 | Eichberger et al. |
| 8,506,096 | B2 | 8/2013 | McCabe et al. |
| 9,013,778 | B2 | 4/2015 | Burdis et al. |
| 9,482,921 | B2 | 11/2016 | Lamine et al. |
| 2003/0227663 | A1 | 12/2003 | Agrawal et al. |
| 2004/0229049 | A1 | 11/2004 | Boire et al. |
| 2007/0097481 | A1 | 5/2007 | Burdis et al. |
| 2011/0260961 | A1 | 10/2011 | Burdis |
| 2012/0015471 | A1 | 1/2012 | Wang et al. |
| 2012/0019889 | A1 | 1/2012 | Lamine et al. |
| 2012/0200908 | A1 | 8/2012 | Bergh et al. |
| 2013/0016417 | A1 | 1/2013 | Veerasamy |
| 2013/0271812 | A1 | 10/2013 | Brown et al. |
| 2013/0286458 | A1 | 10/2013 | Lamine et al. |
| 2014/0104667 | A1 | 4/2014 | Greer et al. |
| 2014/0253996 | A1 | 9/2014 | Burdis et al. |
| 2015/0029573 | A1 | 1/2015 | Burdis et al. |
| 2015/0153622 | A1 | 6/2015 | Kalweit et al. |
| 2016/0109777 | A1 | 4/2016 | Martin et al. |
| 2016/0139476 | A1 | 5/2016 | Garcia et al. |
| 2016/0377907 | A1* | 12/2016 | Wu .................... G02F 1/13731 349/139 |

FOREIGN PATENT DOCUMENTS

| | | |
|---|---|---|
| CN | 201464764 U | 5/2010 |
| EP | 0382623 A1 | 8/1990 |
| EP | 0408427 A1 | 1/1991 |
| EP | 0518754 A1 | 12/1992 |
| EP | 0521602 A1 | 1/1993 |
| EP | 0532408 A1 | 3/1993 |
| EP | 0575207 A1 | 12/1993 |
| EP | 0612826 A1 | 8/1994 |
| EP | 0670346 A1 | 9/1995 |
| EP | 0253713 A1 | 1/1998 |
| EP | 0825478 A1 | 2/1998 |
| EP | 0831360 A1 | 3/1998 |
| FR | 2781062 A1 | 1/2000 |
| FR | 2829723 A1 | 3/2003 |
| FR | 2962818 A1 | 1/2012 |
| JP | S57158623 A | 9/1982 |
| JP | S59195629 A | 11/1984 |
| JP | 2001507818 A | 6/2001 |
| JP | 2007108750 A | 4/2007 |
| JP | 2010108684 A | 5/2010 |
| JP | 2012524290 A | 10/2012 |
| KR | 20080022321 A1 | 3/2008 |
| WO | 2000003290 A1 | 1/2000 |
| WO | 2002006889 A1 | 1/2002 |
| WO | 2003098339 A2 | 11/2003 |
| WO | 2004068231 A1 | 8/2004 |
| WO | 2005007398 A2 | 1/2005 |
| WO | 2009148861 A2 | 12/2009 |
| WO | 2012007334 A1 | 1/2012 |
| WO | 2013090209 A1 | 6/2013 |
| WO | 2014137491 A1 | 9/2014 |
| WO | 2015100419 A1 | 7/2015 |
| WO | 2016100403 A1 | 6/2016 |
| WO | 2018157057 A1 | 8/2018 |

OTHER PUBLICATIONS

Krause et al., "Precise microstructuring of indium-tin oxide thin films on glass by selective femtosecond laser ablation," EPJ Photovoltaics, 2013, pp. 40601-p1-40601-p5, vol. 4.

International Search Report and Written Opinion for PCT/EP2011/060363, dated Sep. 22, 2011, 9 pages.

International Search Report and Written Opinion for PCT/EP2011/061407, dated Sep. 27, 2011, 11 pages.

International Search Report and Written Opinion for PCT/EP2011/061408, dated Oct. 10, 2011, 11 pages.

Chinese Office Action for Application No. 20118004447.3, dated Jul. 2, 2014, 9 pages.

Wei, Hongli et al., "New Progress of Study on Inorganics Electrochromic glass", Glass, No. 1, Feb. 28, 2006, pp. 34-37 ((English summary provided)).

International Search Report and Written Opinion for PCT/US2014/047955, dated Oct. 13, 2014, 10 pages.

International Search Report and Written Opinion for PCT/US2014/011657, dated Apr. 25, 2014, 12 pages.

International Search Report and Written Opinion for PCT/US2018/019719, dated May 24, 2018, 8 pages.

* cited by examiner

ELECTRICAL DEVICE INCLUDING A SUBSTRATE AND A TRANSPARENT CONDUCTIVE LAYER AND A PROCESS OF FORMING THE SAME

CROSS-REFERENCE TO RELATED APPLICATION

The present application claims priority under 35 U.S.C. § 119(e) to U.S. Provisional Patent Application No. 62/464,138, filed Feb. 27, 2017, entitled "Electrical Device Including a Substrate and a Transparent Conductive Layer and a Process of Forming the Same," naming as inventors Sebastian M. Sarrach et al., which application is assigned to the current assignee hereof and is incorporated by reference herein in its entirety.

BACKGROUND

Field of the Disclosure

The present disclosure is directed to electrical devices, and more specifically to electrical devices including substrates and transparent conductive layers and processes of forming the same.

Related Art

An electrical device can include transparent conductive layers coupled to electrodes of an electrochromic device, and bus bars electrically connected to the transparent conductive layers. When forming the electrochromic device, a lower transparent conductive layer is deposited over a substrate and patterned to keep the bus bars from electrically shorting to each other or have unacceptably high leakage current. The patterning is performed before depositing the layers for the electrochromic device and the upper transparent conductive layer. Further improvement in fabricating electronic devices that include an electrochromic device is desired.

BRIEF DESCRIPTION OF THE DRAWINGS

Embodiments are illustrated by way of example and are not limited in the accompanying figures.

Figure 1:
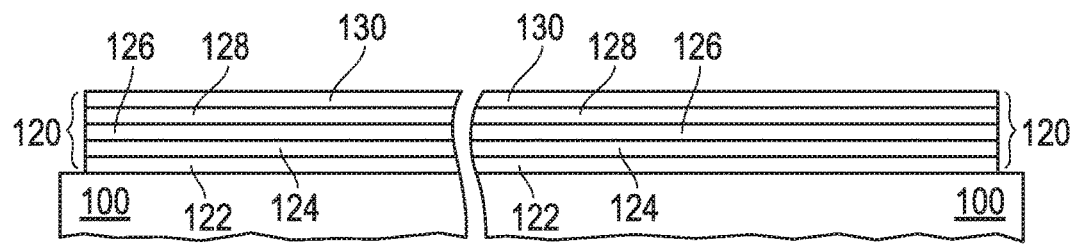
FIG. 1 includes an illustration of a cross-sectional view of portions of a workpiece including a substrate and a stack of layers.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Patterned features, which include bus bars, holes, openings, etc., can have a width, a depth or a thickness, and a length, wherein the length is greater than the width and the depth or thickness. As used in this specification, a diameter is a width for a circle, and a minor axis is a width for an ellipse.

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the glass, vapor deposition, and electrochromic arts.

A stack of layers can be formed adjacent to a substrate before any layer within the stack is patterned. Combinations of substrates and stacks can be made and stored for an extended period, such as more than a week or a month, or shipped to a remote location before further manufacturing occurs. By delaying irreversible patterning until closer to the date a final product will be shipped to a customer, the likelihood of having too much inventory of a particular size or having to scrap windows for a custom order that was cancelled after manufacturing started can be substantially reduced. Further, the likelihood of introducing particles between the layers of the stack can be substantially reduced because no lower layer within the stack needs to be patterned before forming subsequent layers.

The process flows described above are flexible, and many of the patterning operations, such as forming holes, openings, or the high resistance region can be performed in many different orders. Furthermore, many different techniques to pattern the lower conductive transparent layer, which is a buried layer at the time the high resistance region is formed, are disclosed. Thus, skilled artisans have the ability to select a particular technique that best suited the needs or desired for a particular application.

The embodiments as illustrated in the figures and described below help in understanding particular applications for implementing the concepts as described herein. The embodiments are exemplary and not intended to limit the scope of the appended claims.

A. Stack Formation

FIG. 1 includes an illustration of a cross-section view of a partially fabricated electrical device after forming a stack of layers adjacent to a transparent substrate 100, wherein the layers include transparent conductive layers and electrochromic device layers disposed between the transparent conductive layers. In a particular embodiment, the layers within the stack of layers are deposited over the substrate. In an embodiment, the substrate 100 can include a glass substrate, a sapphire substrate, an aluminum oxynitride substrate, or a spinel substrate. In another embodiment, the substrate can include a transparent polymer, such as a polyacrylic compound, a polyalkene, a polycarbonate, a polyester, a polyether, a polyethylene, a polyimide, a polysulfone, a polysulfide, a polyurethane, a polyvinylacetate, another suitable transparent polymer, or a co-polymer of the foregoing. The substrate may or may not be flexible. In a particular embodiment, the substrate 100 can be float glass or a borosilicate glass and have a thickness in a range of 0.5 mm to 4 mm thick. In another particular embodiment, the substrate 100 can include ultra-thin glass that is a mineral glass having a thickness in a range of 50 microns to 300 microns. In a particular embodiment, the substrate 100 may be used for many different electrochromic devices being formed and may referred to as a motherboard.

The compositions and thicknesses of the layers within a stack 120 of layers are described before describing their formation. Transparent conductive layers 122 and 130 can include a conductive metal oxide or a conductive polymer. Examples can include a tin oxide or a zinc oxide, either of which can doped with a trivalent element, such as Al, Ga, In, or the like, or a sulfonated polymer, such as polyaniline, polypyrrole, poly(3,4-ethylenedioxythiophene), or the like. The transparent conductive layers 122 and 130 can have the same or different compositions.

The electrochromic device includes the layers 124, 126, and 128 that are disposed between the transparent conductive layers 122 and 130. The layers 124 and 128 are electrode layers, wherein one of the layers is an electrochromic layer, and the other of the layers is an ion storage layer (also referred to as a counter electrode layer). The electrochromic layer can include an inorganic metal oxide electrochemically active material, such as $WO_3$, $V_2O_5$, $MoO_3$, $Nb_2O_5$, $TiO_2$, $CuO$, $Ir_2O_3$, $Cr_2O_3$, $CO_2O_3$, $Mn_2O_3$, or any combination thereof and have a thickness in a range of 50 nm to 2000 nm. The ion storage layer can include any of the materials listed with respect to the electrochromic layer and may further include nickel oxide ($NiO$, $Ni_2O_3$, or combination of the two), and Li, Na, H, or another ion and have a thickness in a range of 80 nm to 500 nm. An ion conductive layer 126 (sometimes called an electrolyte layer) is disposed between the electrode layers 124 and 128, and has a thickness in a range of 20 microns to 60 microns. The ion conductive layer 126 allows ions to migrate therethrough and does not allow a significant number of electrons to pass therethrough. The ion conductive layer 126 can include a silicate with or without lithium, aluminum, zirconium, phosphorus, boron; a borate with or without lithium; a tantalum oxide with or without lithium; a lanthanide-based material with or without lithium; another lithium-based ceramic material; or the like. The ion conductive layer 126 is optional and, when present, may be formed by deposition or, after depositing the other layers within the stack 120, reacting portions of two different layers, such as the electrode layers 124 and 128, to form the ion conductive layer 126. After reading this specification, skilled artisans will appreciate that other compositions and thicknesses for the layers 122, 124, 126, 128, and 130 can be used without departing from the scope of the concepts described herein.

The layers 122, 124, 126, 128, and 130 can be formed over the substrate 100 without any intervening patterning steps, breaking vacuum or exposing an intermediate layer to air before all the layers are formed. In an embodiment, the layers 122, 124, 126, 128, and 130 can be serially deposited. The layers 122, 124, 126, 128, and 130 may be formed using physical vapor deposition or chemical vapor deposition. In a particular embodiment, the layers 122, 124, 126, 128, and 130 are sputter deposited.

B. Store, Ship, or Continue Processing

Deferring the patterning operation is advantageous for providing flexibility in manufacturing. While manufacturing is occurring, orders may be placed, and other orders may be cancelled or the designs may be changed. The mix of products to be formed from the substrate 100 when manufacturing is started may be different from the mix of products to be formed from the substrate 100 later in the manufacturing process flow. Deferring patterning as long as possible allows production of products to be aligned more closely to orders, and thus, can help reduce inventory and waste for custom orders that are cancelled.

Breaking vacuum or exposing an intermediate layer to air may allow particles or contaminants to be introduced between layers. Particles may cause visible defects or hot spots to be formed. A hot spot can be an electrical short between the transparent conductive layers 122 and 130 caused by a particle. A hot spot will not allow an electrochromic device to turn color locally as the local electrical field near the particle will be too low. Thus, hot spots can also be a type of visible defect. Although a cleaning operation can be used to remove particles, some particles may still remain. Further, the extra handling associated with cleaning, or the previously described patterning, can generate particles. By sequentially forming the layers, particles are substantially less likely to be formed between layers because handling is reduced.

Any or all of the layers within the stack 120 can be deposited over substantially all of the substrate 100. In an embodiment, a small lateral gap (side-to-side in FIG. 1) may remain between the edges of the layers within the stack 120 and the edges of the substrate 100. Such gap can allow handlers or a portion of equipment to contact the substrate 100 without contacting the layers within the stack 120, which can help to reduce particle problems should any handling equipment need to contact the substrate 100 along the edges or primary surface of the substrate closer to the stack 120.

At this point in the process flow, the substrate 100 and stack 120 may be stored or shipped, or manufacturing may be continued. The manufacturing equipment used to form the layers within the stack 120 may be better suited to being operated as a continuous production line. The substrate 100 and stack 120, along with potentially other substrates and stacks may be processed during a production run and then stored until the substrates and stacks are needed. The substrates and stacks may be stored in an inert environment, and such an inert environment may include $N_2$, Ar, another noble gas, clean dry air, another suitable gas that does not significantly react with any of the layers when at room temperature, or any combination thereof.

The substrate 100 and stack 120 may be shipped to another facility where production will be continued. The equipment used for forming the stack 120 over the substrate 100 may involve more complex equipment and have more highly skilled technical personnel to operate and maintain such equipment, as compared to equipment used for the remainder of manufacturing. In addition or alternatively, the clean room specifications when forming the stack 120 of layers may be higher than the clean room specifications when performing the remainder of the processing. Thus, commercial levels of production may be more conducive to having more technologically demanding operations performed at one facility and less technologically demanding operations performed at another facility. The different facilities may be separated by a difference of at least 1 km, at least 50 km, at least 200 km, at least 5000 km, or even further. Alternatively, the different facilities may be on the same property.

Depending on whether the substrate 100 and stack 120 is stored or shipped, a day, a week, a month, or over a ½ year may elapse between the time the formation of the stack 120 is completed and any of the layers within the stack 120 are patterned or another layer or component is permanently formed over the substrate.

Figure 2:
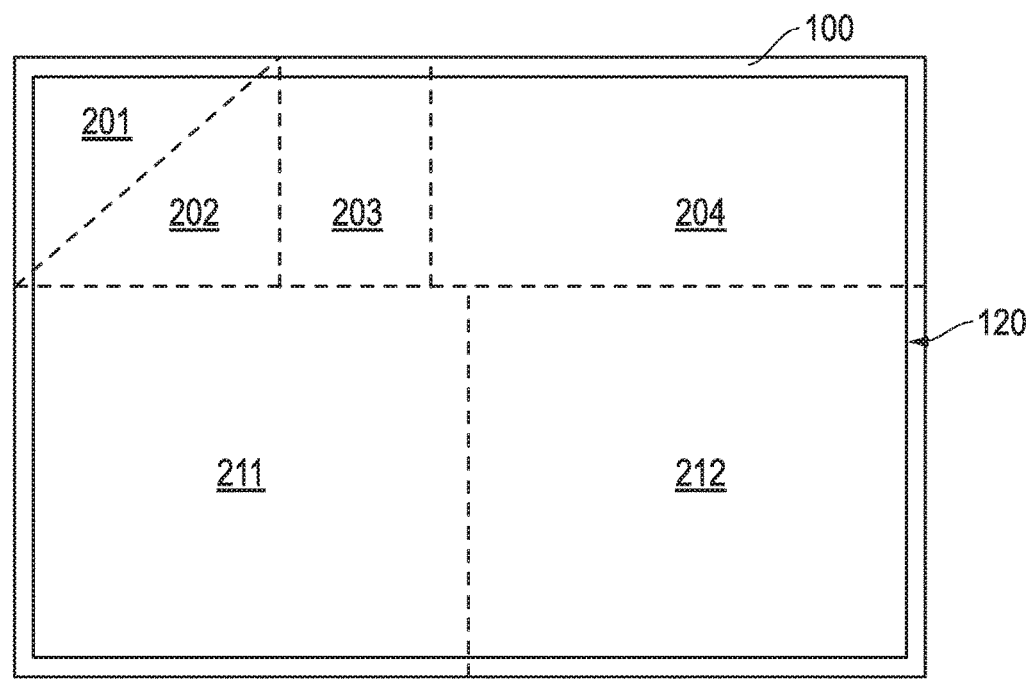
FIG. 2 includes an illustration of a top view of the workpiece of FIG. 1 depicting different regions that correspond to different electrochromic devices that can be formed from the workpiece.

Regardless whether the manufacturing is performed as a more continuous process or a discontinuous process (for example, due to storing, shipping, or both), the physical design of the electrochromic devices to be generated from the substrate 100 can be determined. FIG. 2 includes a non-limiting, exemplary physical design where dashed lines illustrate intended subsequent cuts that will be made to obtain the different electrochromic devices from the substrate 100. Regions 201 and 202 correspond to triangular shaped electrochromic devices, regions 203 and 204 correspond to relatively smaller rectangular shaped electrochromic devices, and regions 211 and 212 correspond to relatively larger rectangular shaped electrochromic devices. The regions 201 and 202 can have substantially the same size, and the regions 211 and 212 can also have substantially the same size. Each of regions 203 and 204 has a different size and shape as compared to all other regions. In another embodiment, a different physical layout may be used. For example, the layout may produce all regions having substantially the same shape and size. In another example, other shapes can include polygons with more than four sides, circles, ellipses, and complex geometries, such as those for vehicle windows.

C. Selective Removal of Layers and Forming Bus Bars

Processing can continue with selectively removing a portion of one or more of the layers within the stack 120 at desired locations. The order of performing some of actions regarding selective removing and forming bus bars may be performed in a different order than what is presented. Thus, after reading the specification, skilled artisans will be able to determine what order to perform the actions to meet the needs or desires for a particular application or equipment configuration within a facility.

1. High Resistance Region within Layer 122

Both subsequently-formed bus bars may contact the lower transparent conductive layer 122. The lower transparent conductive layer 122 can be patterned to form a high resistance region between spaced-apart bus bars. In an embodiment, the high resistance region is adjacent to a location where a bus bar will be subsequently formed to keep the bus bars from electrically shorting to each other or having an unacceptably high leakage current between the bus bars. As will be described later in this specification, the high resistance region can be spaced significantly apart from both bus bars in an alternative embodiment. At this point in the process, the lower transparent conductive layer 122 is a buried layer, and therefore, some care may be used in rendering a portion of the lower transparent into a high resistance region. The high resistance region may only include a transparent conductive layer or a combination of such transparent conductive layer and an adjacent layer, such as an electrode layer. The formation of the high resistance region can be accomplished using different methods, one of which is described below and others are described later in this specification. Such methods are merely illustrative and are not meant to limit the scope of the present invention, as set forth in the appended claims.

If the workpiece including the substrate 100 and stack 120 was stored or shipped, the workpiece can be removed from a container or package in which the workpiece was stored or shipped. If needed or desired, the workpiece is cleaned or otherwise treated before proceeding with further processing.

Figure 3:
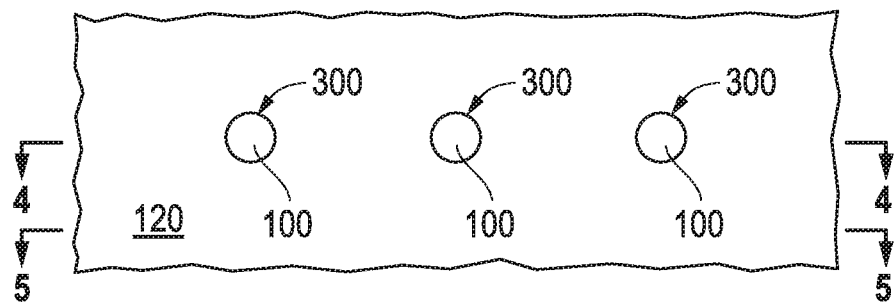
FIG. 3 includes an illustration of a top view of a portion of the workpiece of FIG. 2 after forming holes through a stack of layers.
Figure 4:
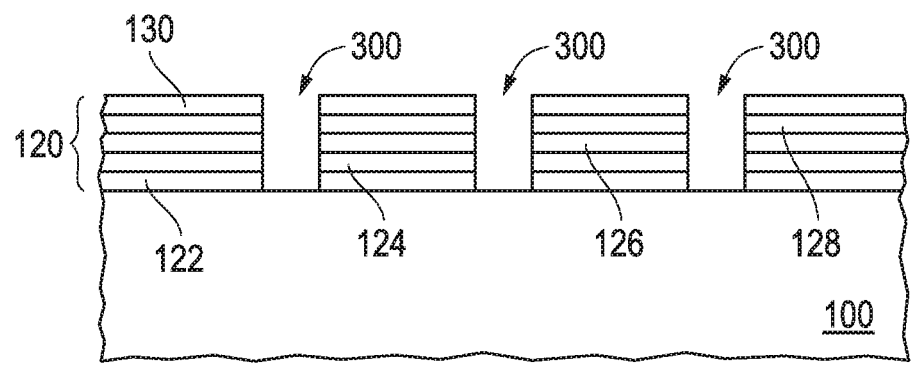
FIG. 4 includes an illustration of a cross-sectional view of the portion of the workpiece of FIG. 3 along sectioning line 4-4.
Figure 5:
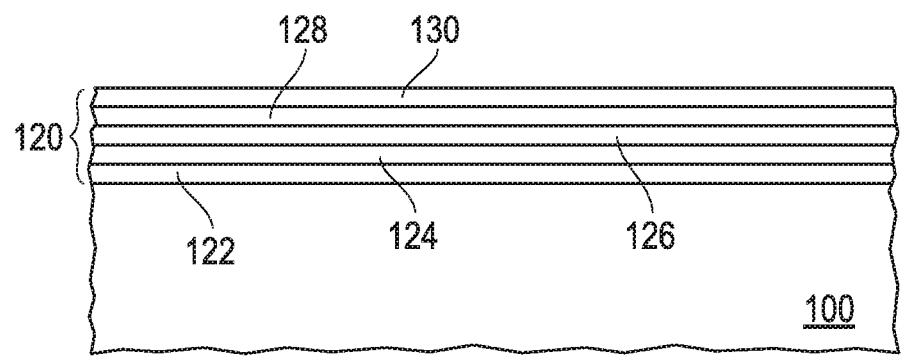
FIG. 5 includes an illustration of a cross-sectional view of the portion of the workpiece of FIG. 3 along sectioning line 5-5.

FIGS. 3 to 5 includes illustrations of views of a portion of the workpiece illustrated in FIG. 2 after patterning the stack 120 to define holes 300 extending to the substrate 100. FIG. 3 includes a top view of the workpiece after patterning. In FIG. 3, the stack 120 is visible at all locations except within the holes 300. From the top view, the substrate 100 is visible along the bottom of the holes 300. FIGS. 4 and 5 include cross-sectional views along sectioning lines 4-4 and 5-5, respectively, in FIG. 3. As illustrated in FIGS. 4 and 5, portions of the stack 120 away from the holes 300 are substantially unaffected by the patterning operation when forming the holes 300.

In an embodiment, the holes 300 can have an average diameter of at least 2 microns, at least 5 microns, or at least 11 microns, and in another embodiment, the holes 300 can have an average diameter of at most 900 micron, at most 200 microns, or at most 50 microns. In another embodiment, the holes 300 may not be circular. In a particular embodiment, as seen from a top view, the holes 300 may be ellipses, and the average minor axis may have a value as previously described with respect to the average diameter. In another particular embodiment, as seen from a top view, the holes 300 may be polygons, and the average width may have a value as previously described with respect to the average diameter. The pitch (center-to-center spacing) for the holes 300 may be substantially uniform or non-uniform. In an embodiment, the holes 300 can have an average pitch of at least 2 microns, at least 5 microns, or at least 11 microns, and in another embodiment, the holes 300 can have an average pitch of at most 900 micron, at most 200 microns, or at most 50 microns. On a relative basis, within the set of holes 300, immediately adjacent holes 300 are separated by distances, and 90% of the distances are at most three times the average diameter (width) of the set of holes 300 or at most two times the average diameter (width) of the set of holes. After reading this specification, skilled artisans will understand that the size and spacing for the holes 300 are not limited to the values previously described, and the particular size and spacing selected may depend on the needs or desires for a particular application.

The holes 300 may be formed using a laser, a stamp, or a lithographic process. In an embodiment, the laser may be directed through the substrate 100 to the stack 120. Thus, the wavelength of laser is selected so that the energy of the laser is more substantially absorbed by one or more of the layers within the stack 120 as compared to the substrate 100. For example, when the substrate 100 includes a mineral glass, and the lower transparent conductive layer 122 includes an indium-doped tin oxide ("ITO"), the wavelength of the electromagnetic radiation can be in the infrared region, as ITO more strongly absorbs infrared radiation as compared to mineral glass. The selection of a particular laser and its corresponding wavelength may depend on the particular materials within the substrate 100 and stack 120.

In another embodiment, the laser may be directed so that the laser beam reaches the stack 120 before reaching the substrate 100. The selection of the laser may be similar to the criteria used when the laser beam is directed through the substrate 100. This particular method may require a higher energy density and have holes that are less precisely defined (sidewalls of the holes are not as vertical), as compared to the method where the laser beam is directed through the substrate 100.

In another embodiment, a stamp may be used to pattern the stack 120 to define the holes 303. The stamp may be part of a machine press or may be in the form of a pattern on or attached to a roller.

In still another, a masking operation may be used. A mask having a pattern with openings corresponding to the holes 300 may be placed or formed over the stack 120. Portions of the stack 120 underlying the openings in the mask can be removed to form the holes 300. The mask can be removed after the holes 300 have been defined.

In a further embodiment, the holes 300 do not need to completely extend through the entire stack 120 and exposed the substrate 100. For example, the holes 300 may not extend through the lower transparent conductive layer 122 or the electrode layer 124. Many other options for forming the holes 300 can be used. After reading this specification, skilled artisans will be able to select a particular process that work well for a specific application.

Figure 6:
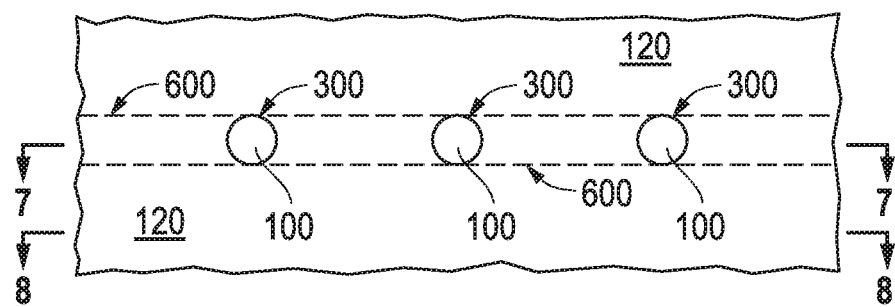
FIG. 6 includes an illustration of a top view of the portion of the workpiece of FIG. 3 after forming a high resistance region in accordance with an embodiment.
Figure 7:
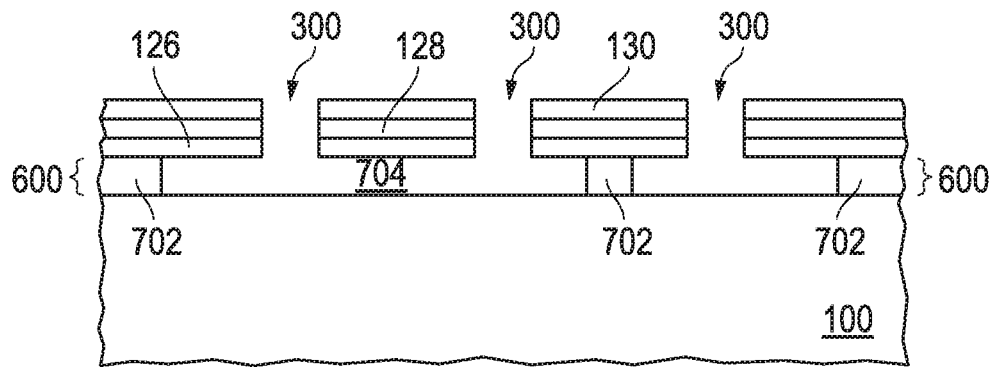
FIG. 7 includes an illustration of a cross-sectional view of the portion of the workpiece of FIG. 6 along sectioning line 7-7.
Figure 8:
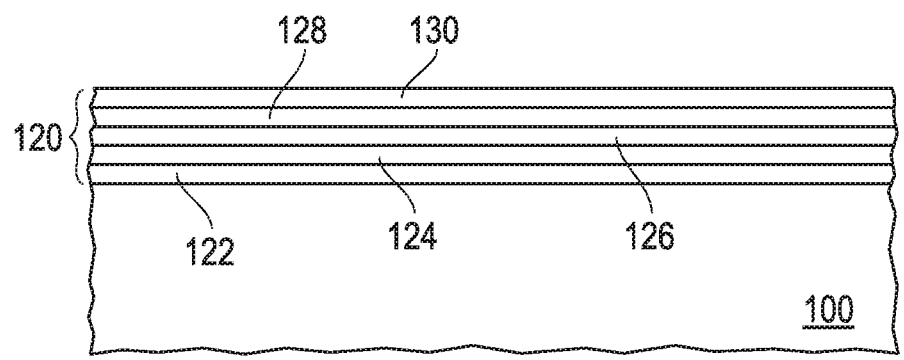
FIG. 8 includes an illustration of a cross-sectional view of the portion of the workpiece of FIG. 6 along sectioning line 8-8.

FIGS. 6 to 8 include illustrations of views of the portion of the workpiece illustrated in FIGS. 3 to 5 after forming a high resistance region 600 from a portion of the lower transparent conductive layer 122. The conversion can result in an electrical open or a highly resistive portion where leakage current between the substantially-formed bus bars is below a specified maximum allowable current for the device when not in a switching state. Thus, the high resistance region is intended to mean a portion of a conductive layer, such as the lower transparent conductive layer 122, that has been removed or has become significantly higher in its resistance as compared to another portion of such conductive layer that is to remain conductive. FIG. 6 includes a top view of the workpiece after forming the high resistance region 600. In FIG. 6, the dashed lines indicate that the high resistance region 600 is covered by other layers in the stack 120. FIGS. 7 and 8 include cross-sectional views along sectioning lines 7-7 and 8-8, respectively, in FIG. 6. More details with respect to FIG. 7 are described below. As illustrated in FIG. 8, portions of the stack 120 away from the holes 300 and high resistance region 600 are substantially unaffected when forming the high resistance region 600.

In an embodiment, the high resistance region 600 can have a width of at least 2 microns, at least 5 microns, or at least 11 microns, and in another embodiment, the high resistance region 600 can have a width of at most 900 micron, at most 200 microns, or at most 50 microns. The high resistance region 600 can have a width that wider or narrower than the average width of the holes 300. After reading this specification, skilled artisans will understand that the width for the high resistance region 600 is not limited to the values previously described, and the particular width selected may depend on the needs or desires for a particular application.

Some care may be exercised when forming the high resistance region 600, as the lower transparent conductive layer 122 is a buried layer at this point in the process. The upper transparent conductive layer 130 remains intact over the high resistance region 600, and thus, the upper transparent conductive layer 130 remains conductive after formed over the high resistance region 600.

The high resistance region 600 can be formed by using an energy source that selectively affects the lower transparent conductive layer 122 and does not significantly affect the upper transparent conductive layer 130. In an embodiment, electromagnetic radiation can be used to heat the portion of the lower transparent conductive layer 122. The compositions of the lower and upper conductive layers 122 and 130 may be different, so that the electromagnetic region is absorbed significantly more strongly by the lower conductive layer 122 as compared to the upper transparent conductive layer 130. Thus, the proper selection of materials for the lower and upper conductive layers 122 and 130 and the wavelength for the electromagnetic radiation can allow for the high resistance region 600 to be formed without significantly damaging the upper transparent conductive layer 130.

In another embodiment, the lower and upper transparent conductive layers 122 and 130 may have the same composition. In another embodiment, the lower and upper transparent conductive layers 122 and 130 may have different compositions, but one material of the layers 122 and 130 may have significant absorbance of the electromagnetic radiation. A laser may be used where the energy density used to form the high resistance region 600 is less than the energy density used to form the holes 300. Further, the laser may be pulsed to reduce likelihood that too much heat would be transmitted to the upper conductive layer 130. FIG. 7 includes an illustration where a laser is used to selectively form the high resistance region 600. In this particular embodiment, portions of the lower transparent conductive layer 122 and the lower electrode layer 124 can intermix to form intermixed regions 702. The resistivity of the intermixed regions 702 is higher than it is for the material that makes up the lower transparent conductive layer 122. Portions of the lower transparent conductive layer 122 may be removed between openings 300, such as within region 704, in addition to forming the intermixed regions 702.

In still another embodiment (not illustrated), another transparent layer may be formed between the substrate 100 and the lower transparent conductive layer 122, where the electromagnetic radiation causes such other transparent layer and the lower transparent conductive layer 122 to intermix or react with each other. Thus, the lower electrode layer 124 does not need to intermix with the lower transparent conductive layer 122. In still a further embodiment, a portion of only the lower transparent conductive layer 122 is converted to the high resistance region 600.

In a further embodiment, an isotropic etchant can be used to selectively etch the lower transparent conductive layer 122. Such an embodiment may be used when the transparent conductive layers 122 and 130 have different compositions. A wet or dry isotropic etchant can be introduced into the holes 300 and etch the lower transparent conductive layer 122 at a significantly higher rate than any of the other layers within the stack 120 and the substrate 100. All or most of the lower transparent conductive layer 122 between the holes 300 may be removed in forming the high resistance region. Skilled artisans appreciate that this embodiment may not have the same level of dimensional control as compared to the other embodiments; however, isotropic etching may still be used if needed or desired.

After forming the high resistance region 600, the remainder of the stack 120 remains undisturbed, as illustrated in FIG. 8. In an embodiment, the upper conductive layer 130, the upper electrode layer 128, and the ion conductive layer 126 remain intact over the high resistance region 600. Thus, the layers 126, 128, and 130 are similar to a bridge over the region 704 and are supported at locations outside the high resistance region 600. The layers 126 and 128 do not need to be present over the region 704 and still achieve a functional device.

Figure 9:
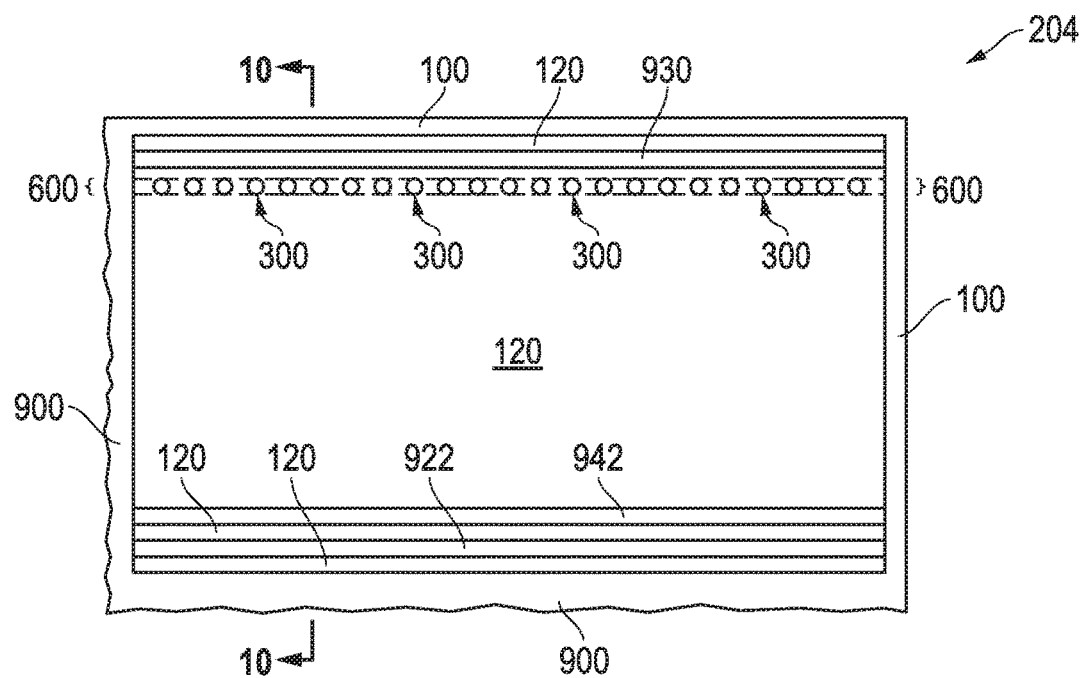
FIG. 9 includes an illustration of a top view of the workpiece of FIG. 6 after forming cutting lanes and openings.
Figure 10:
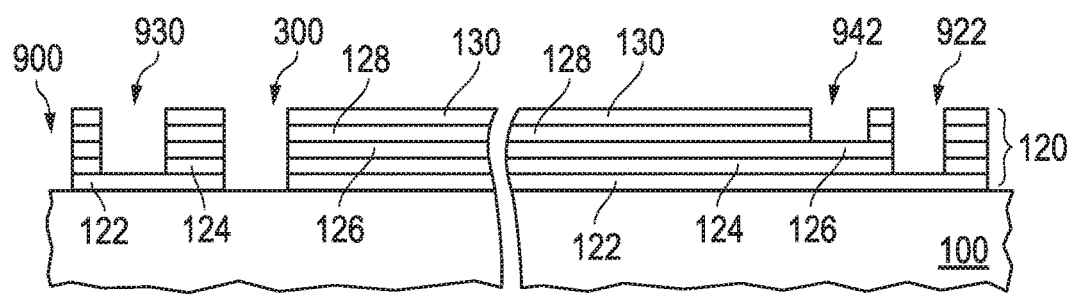
FIG. 10 includes an illustration of a cross-sectional view of the portion of the workpiece of FIG. 9 along sectioning line 10-10.

FIGS. 9 and 10 include top and cross sectional view after patterning layers within the stack 120 to form cutting lanes 900 that are used in defining individual electrochromic devices, openings 922 and 930 for subsequently-formed bus bars, and an opening 942 for proper electrical connections with respect to the subsequently-formed bar bars. FIG. 10 corresponds to sectioning line 9-9 in FIG. 9. The reason and location of the opening 942 may be easier to understand after describing the openings 922 and 930, which may be easier to understand after describing the cutting lanes 900. The order of formation of the cutting lanes 900 and openings 922, 930, and 942 do not need to be performed in the order presented. Thus, operations for the cutting lanes 900 and openings 922, 930, and 942 may be performed in an order that meets the needs and desires for a particular application, equipment availability or configuration, or a particular process flow.

2. Cutting Lanes 900

The cutting lanes 900 separate the stack 120 into separate parts corresponding to individual electrochromic devices. For example, referring to FIG. 2, the cutting lanes 900 are formed where the dashed lines are seen in FIG. 2. In a particular embodiment, a portion of the stack illustrated in FIGS. 9 and 10, corresponds to the region 204 in FIG. 2. A tool, such as a saw, a laser, or the like, can be used within the cutting lanes 900 to cut the substrate 100, which includes different portions of the stack 120 defined by the cutting lanes 900, to separate the substrate 100 into different parts that correspond to the individual electrochromic devices. The widths of the cutting lanes 900 are sufficient to allow the tool to cut the substrate 100 without the tool contacting the stack 120. In the embodiment as illustrated, the cutting lanes 900 extend through all layers of the stack 120. In another embodiment (not illustrated), the cutting lanes 900 may extend through one of the transparent conductive layers 122 or 130 but not to the other of the conductive layers 122 and 130. The cutting lanes 900 can be defined using any of the techniques previously described with respect to the holes 300. The technique used to define the cutting lanes 900 may the same or different as compared to patterning the stack 120 to define the holes 300.

3. Openings 922 and 930

The openings 922 and 930 correspond to regions where bus bars will be subsequently formed. The openings 922 and 930 extend to the lower transparent conductive layer 122. In another embodiment, the openings 922 and 930 may extend through the lower transparent conductive layer 122, and subsequently-formed bus bars may contact the sidewalls of the lower transparent conductive layer 122. In a further embodiment, the openings 922 and 930 may extend through different layers. In still a further embodiment, the opening 930 may not be formed, as contact to the upper transparent conductive layer 130 may be made along its exposed upper exposed surface. The width of at least the openings 922 is sufficient to allow low contact resistance to the lower transparent conductive layer 122. In an embodiment, the widths of the openings 922 and 930 are substantially the same, and the depths of the openings 922 and 930 are substantially the same. In such an embodiment, the subsequent formation of the bus bars will be more similar to one another as compared to the openings 922 and 930 having different widths or different depths. For example, within the openings 922 and 930, the rate of dispensing material for the bus bars per unit distance may be substantially the same. Referring to FIG. 9, the openings 922 and 930 have lengths that may extend completely to the cutting lanes 900 near the left-hand and right-hand sides of FIG. 9 or may stop before reaching such cutting lanes. The openings 922 and 930 can be defined using any of the techniques previously described with respect to the holes 300; however, when using a laser beam that passes through the substrate 100, the wavelength of the laser beam should be absorbed by the layers being patterned and not significantly adversely affect portions of the layers of the stack 120 that are not to be patterned. If the transparent conductive layers 122 and 130 have the same composition and the transparent conductive layer 122 is to remain along bottoms of the openings 922 and 930, a laser beam passing through the substrate 100 may not be used. The technique used to define the openings 922 and 930 may be the same or different as compared to defining the holes 300, the cutting lanes 900, or both.

4. Opening 942

The opening 942 provides a function similar to the high resistance region 600. The opening 942 keeps the subsequently-formed bus bar within the opening 922 from being electrically connected to the portion of the upper transparent conductive layer 130 that is used in controlling of the electrochromic device. Thus, the opening 942 extends at least through the upper transparent conductive layer 130. In embodiment as illustrated, the opening 942 extends through the upper transparent conductive layer 130 and the upper electrode 128. In another embodiment (not illustrated), the opening 942 may extend though the ion conductive layer 126 or may further extend through the lower electrode layer 124. Referring to FIG. 9, the opening 942 has a length that may extend completely to the cutting lanes 900 near the left-hand and right-hand sides of FIG. 9 or may stop before reaching such cutting lanes. The opening 942 can be defined using any of the techniques previously described with respect to the holes 300; however, when using a laser beam that passes through the substrate 100, the wavelength of the laser beam should be absorbed by the layer(s) being patterned and not significantly adversely affect the layers of the stack 120 that are not to be patterned. If the transparent conductive layers 122 and 130 have the same composition, a laser beam passing through the substrate 100 may not be used. The technique used to define the opening 942 may be the same or different as compared to define the holes 300, the cutting lanes 900, the openings 922 and 930, or any combination thereof.

5. Bus Bars 1122 and 1130

Figure 11:
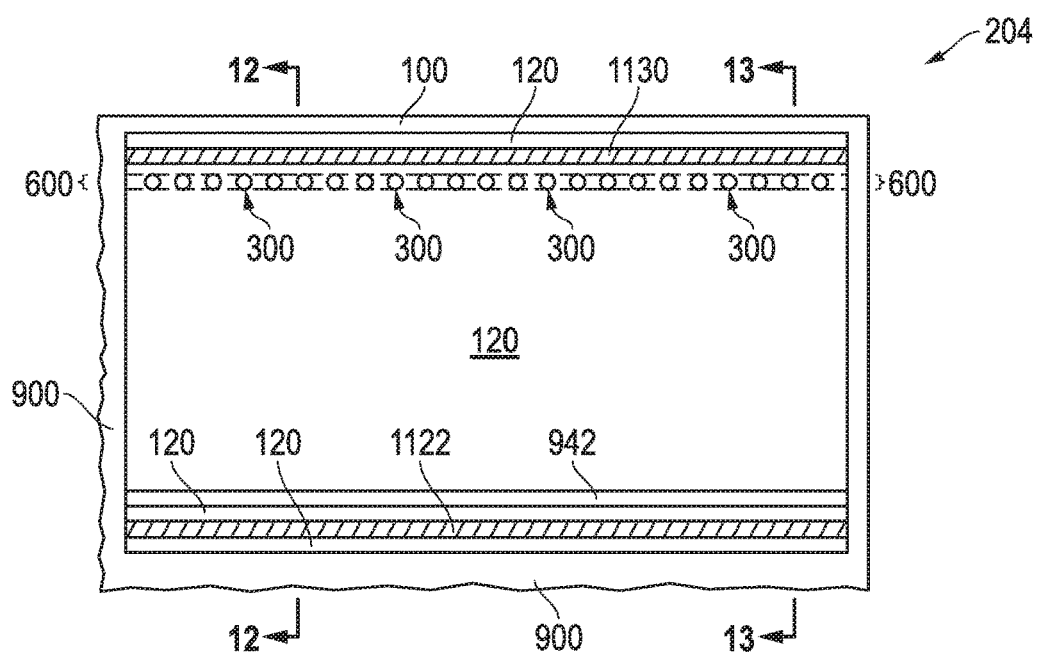
FIG. 11 includes an illustration of a top view of the workpiece of FIG. 9 after forming bus bars.
Figure 12:
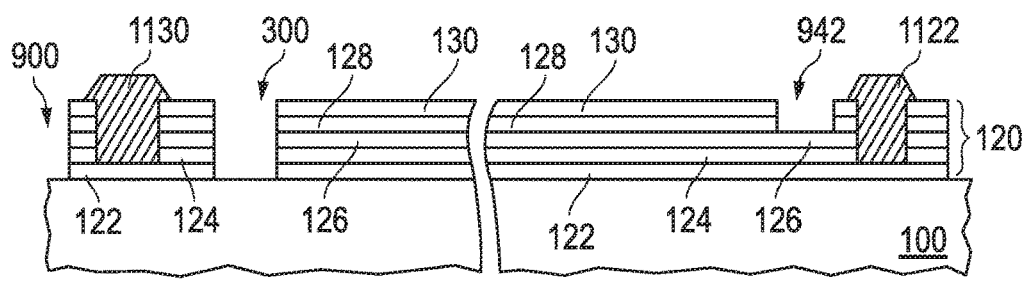
FIG. 12 includes an illustration of a cross-sectional view of the portion of the workpiece of FIG. 11 along sectioning line 12-12.
Figure 13:
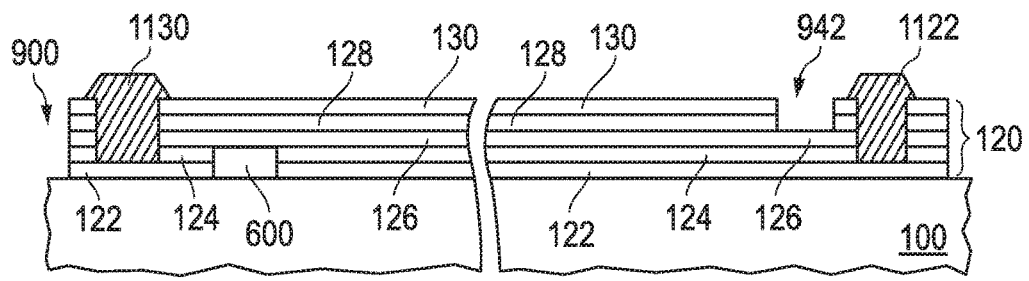
FIG. 13 includes an illustration of a cross-sectional view of the portion of the workpiece of FIG. 11 along sectioning line 13-13.

FIGS. 11, 12, and 13 include illustrations of top and cross-sectional views of the workpiece after forming bus bars 1122 and 1130. FIG. 12 includes a cross-sectional view through one of the holes 300 along sectioning line 12-12 in FIG. 11, and FIG. 13 includes a cross sectional view between two holes 300 along sectioning line 13-13 in FIG. 11. Referring to FIG. 11, each of the bus bars 1122 and 1130 has a length. In an embodiment, the lengths of the bus bars 1122 and 1130 are substantially parallel to each other. As used herein, substantially parallel is intended to mean that the lengths are within 9° of being parallel to each other. Each of the opening 942 and the high resistance region 600 has a length. Either or both of the lengths of the bus bars are substantially parallel to the length of the opening 942. Either or both of the lengths of the bus bars are substantially parallel to the length of the high resistance region 600. Further, the length of high resistance region 600 extends is at least 2% of the length of either or both of the bus bars 1122 and 1130, and in the embodiment as illustrated, the length of the high resistance region 600 is at least 50%, at least 80%, at least 90% or at least 95% of the length of either or both of the bus bars 1122 and 1130. When the length of the high resistance region 600 is 90% or more of the length of the bus bar 1130, such length helps to keep leakage current between the bus bars 1122 and 1130 via the lower transparent conductive layer 122 sufficiently low.

The bus bar 1122 is formed within the opening 922 (FIGS. 9 and 10), contacts the lower transparent conductive layer 122, and is used to the control the lower transparent conductive layer 122 for the electrochromic device. The bus bar 1122 also contacts a relatively small portion of the upper conductive layer 130; however, the opening 942 electrically isolates the bus bar 1122 from the portion of the upper transparent conductive layer 130 that is used to control the electrochromic device.

The bus bar 1130 is formed within the opening 930 (seen in FIGS. 9 and 10) and contacts the upper transparent conductive layer 130. As seen in FIG. 12, the hole 300 is adjacent to the bus bar 1130. However, the cross-sectional view in FIG. 13 is taken along a plane between holes 130. As further seen in FIG. 13, the upper transparent conductive layer 130, the upper electrode layer 128, and the ion conductive layer 126 are intact above high resistance region 600. As seen in FIG. 11, such portions of the upper transparent conductive layer 130 allow the bus bar 1130 to control of the voltage on the upper electrode layer 128 for the electrochromic device. The bus bar 1130 also contacts a relatively small portion of the lower conductive layer 122; however, the high resistance region 600 keeps the bus bar 1130 from being electrically connected to the other portion of the lower transparent conductive layer 122 that is used to control the electrochromic device.

In the embodiment as illustrated, from a top view, the distance between the high resistance region 600 and its closer bus bar, the bus bar 1130, can be kept relatively small, so that more area of the electronic device can change when the transmission of visible light though the electrochromic device is reduced. In an embodiment from a top view, the distance between the high resistance region 600 and the bus bar 1130 is at most 20 mm, at most 9 mm, or at most 2 mm, an in another embodiment from a top view, the high resistance region 600 can be at least 0.01 mm away from the bus bar 1130.

The bus bars 1122 and 1130 include a material that is more conductive than the material of the transparent conductive layers 122 and 130. The bus bars 1122 and 1130 can include a conductive material, such as silver, gold, copper, aluminum, or the like. In a particular embodiment, the conductive material may be part of a metal frit within an ink. When in the form of an ink, the ink may be printed onto the workpiece within the openings 922 and 930. After dispensing the ink, the workpiece can be fired to evaporate any liquid in the ink, lower the resistance of the remaining material, and reduce contact resistance with the lower transparent conductive layer 122. In another embodiment, the conductive material may be dispersed within a viscous fluid. The viscous fluid can be cured to form a metal-filled polymer, such as a metal-filled epoxy.

6. Cutting the Substrate into Individual Panels

The substrate 100 is cut into panels where each panel includes portions of the transparent conductive layers 122 and 130 and an electrochromic device that include portions of the electrode layers 124 and 128 and the ion conductive layer 126. Referring to FIG. 2, cutting can be performed to separate the regions 201 to 204, 211, and 212 into individual panels. The cutting can be performed by a laser or mechanical device, such as a scribe wheel or saw.

Many different operations have been described in sections 1 to 6 above. The order of performing the operations may be changed, and therefore, the listing above is not a required order for performing the operations. However, some operations are performed before others due to the configuration or for convenience. For example, patterning the stack 120 to form the openings 922 and 930 are performed before forming the bus bars 1122 and 1130. In another embodiment, the opening 930 may not be formed, and the bus bar 1130 may be formed over the upper transparent conductive layer 130. As another example, the stack 120 is patterned to define the cutting lanes 900 before cutting is performed. The cutting operation may be more complicated or result in an electrical short or leakage path if the cutting is performed through the substrate 100 and the stack 120, as opposed to the substrate 100 where the stack 120 has been previously been removed. When the cutting operation is delayed to the end of the operations described in sections 1 to 6, all of the equipment used in performing sections 1 to 6 may be tailored for one or only a few sizes of substrates that can help in reducing the number of pieces of equipment needed for handling the substrate or number of equipment set-ups due to different sizes of substrates.

If needed or desired the holes 300 may be filled or sealed to reduce the likelihood of a contaminant from entering any of the holes 300 and reacting or having an adverse interaction with any of the materials exposed by the holes. For example, water vapor in air may react with lithium within the electrochromic device. The holes 300 may be filled or sealed with a transparent polymer, sputtered glass, or the like.

C. Subsequent Processing

Figure 14:
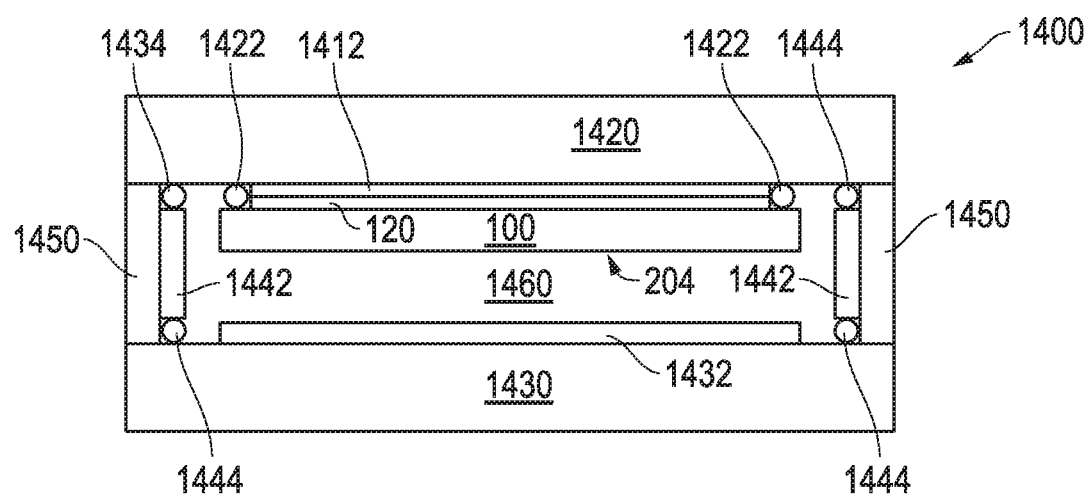
FIG. 14 includes illustration of a cross-sectional view of an insulating glass unit that includes the workpiece of FIG. 11.

The workpieces produced after performing the operations in sections 1 to 6 can be laminated to another transparent substrate, used in forming an insulated glass unit (IGU), or the like. FIG. 14 includes an illustration of a cross-sectional of IGU 1400 that includes the substrate 100 and the stack 120. The individual layers of the stack 120 and bus bars 1122 and 1130 are not separately illustrated in FIG. 14 to simplify understanding of components within the IGU 1400. Referring to FIGS. 2 and 14, the combination of the substrate 100 and stack 120 corresponds to region 204 of the substrate 100. The IGU 1400 further includes an outer substrate 1420 and a solar control film 1412 disposed between the stack 120 and the outer substrate 1420. A seal 1422 is disposed between the substrate 100 and the outer substrate 1420 and around the stack 120. The seal 1422 can include a polymer, such as polyisobutylene. The outer substrate 1420 is coupled to a pane 1430. Each of the outer substrate 1420 and pane 1430 can be a toughened or a tempered glass and have a thickness in a range of 2 mm to 9 mm. A low-emissivity layer 1432 can be disposed along an inner surface of the pane 1430. The outer substrate 1420 and pane 1430 can be spaced apart by a spacer bar 1442 that surrounds the substrate 100 and stack 120. The spacer bar 1442 is coupled to the outer substrate 1420 and pane 1430 via seals 1442. The seals 1442 can be a polymer, such as polyisobutylene. The seals 1442 can have the same or different composition as compared to the seal 1422. An adhesive joint 1450 is designed to hold the outer substrate 1420 and the pane 1430 together and is provided along the entire circumference of the edges of the outer substrate 1420 and the pane 1420. An internal space 1460 of the IGU 1400 may include a relatively inert gas, such as a noble gas or dry air. In another embodiment, the internal space 1460 may be evacuated. Other designs for IGUs may be used if needed or desired for a particular application.

While many details are seen in FIG. 14, the use of the substrate 100 and stack 120 is not limited to IGUs. For example, the combination of the substrate 100 and stack 120 may be used to form a vehicle window, such as part of a moon roof, a side passenger window, or the like. A shaping or other operation may be performed to a desired shape, such as slightly curved to conform to the curvature of a vehicle. Thus, the examples are merely illustrative and do not limit the scope of the present invention as defined in the appended claims.

D. Alternative Methods for the High Resistivity Region

1. Pressure During Formation of the High Resistance Region

Figure 15:
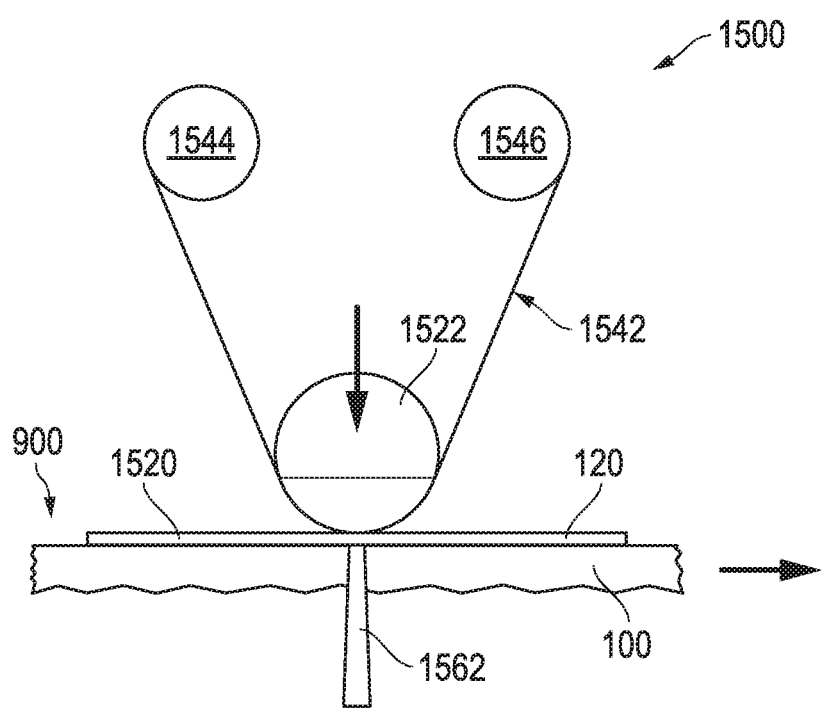
FIG. 15 includes an illustration of a cross-sectional view of the workpiece of FIG. 1 after forming a high resistance region in accordance with an alternative embodiment.

Pressure may be applied to the stack 120 while the high resistance region is being formed. The pressure is applied such that the stack 120 is not substantially damaged by the application of the pressure. Thus, the upper transparent conductive layer 128 remains conductive and intact after the pressure is applied. FIG. 15 includes an embodiment in which pressure (illustrated by the arrow near the center of the illustration) is applied to the portion of the stack 120 as a portion of the lower transparent conductive layer 122 (not individually illustrated in FIG. 15) is being converted to a stack 1520 having a high resistance region. The stack 1520 may be similar to the stack 120 after forming the high resistance region 600, where one or more of the layers within the stack are converted to the high resistance region, whereas other layers within the stack are not significantly affected by the conversion. In the embodiment illustrated, a pressure mechanism 1500 includes a roller 1522 that applies downforce pressure on the stack at an area above the laser beam 1562. In an embodiment, the workpiece can be moved in the direction illustrated with the arrow near the right-hand side of the illustration. In another embodiment, the workpiece may be stationary and the pressure mechanism 1520 and laser 1562 may be moved. If needed or desired, a film 1542 may be disposed between the roller 1522 and the stack to reduce damage or contamination of the stack by the roller 1522. The film can pass from a feed reel 1544, between the roller 1522 and stack, and be taken up by a take-up reel 1546. In an alternative embodiment, the film 1542 and reels 1544 and 1546 may not be used.

In a different embodiment, the pressure mechanism 1600 can include a plate 1620 that is coupled to a shaft 1622 that is part of a press. The arrow above the shaft 1622 illustrates the exerted force, and the arrow beside the laser illustrates the movement of the laser relative to the substrate. The plate 1620 can help to more uniformly distribute the force over a larger area of the substrate. Thus, a relatively higher force can be used, as compared to the roller 1522, without causing an increase in pressure on the stack and substrate 100 above the laser beam 1562.

Figure 16:
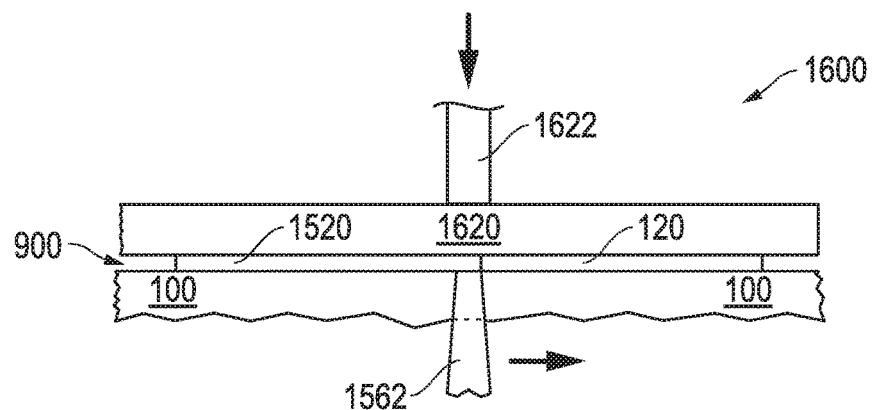
FIG. 16 includes an illustration of a cross-sectional view of the workpiece of FIG. 1 after forming a high resistance region in accordance with an alternative embodiment.

The process of forming a high resistance region within the stack 120 to obtain the stack 1520 with the high resistance region can use techniques previously described with respect to the high resistance region 600. The holes 300 may or may not be formed in the embodiments as illustrated in FIGS. 15 and 16. Thus, the formation of the high resistance region in stack 1520 is not limited to the embodiment as illustrated in FIGS. 15 and 16.

2. Material Over Stack Before Forming the High Resistance Region

Figure 17:
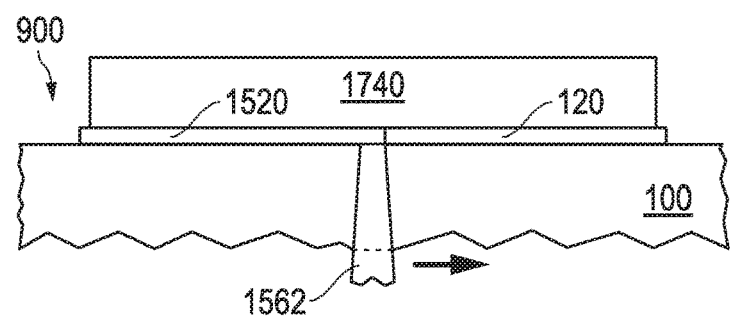
FIG. 17 includes an illustration of a cross-sectional view of the workpiece of FIG. 1 after forming a high resistance region in accordance with another alternative embodiment.

FIG. 17 illustrates an embodiment where a sheet or strip of material 1740 is placed or formed over the stack. Thus, the material 1740 may extend beyond the edges of the underlying stack or the substrate 100 or a cut portion of the substrate 100 (if cutting has been previously performed). The material 1740 may be placed over substantially all of the stack 120 or may be localized to where the stack 1520, including a high resistance region, is to be formed. In the embodiment as illustrated in FIG. 17, a laser beam 1562 moves from the left-hand side to the right-hand side of the illustration. In another embodiment, laser beam 1562 may be stationary and the workpiece can be moved. The process for forming a high resistance region within the stack 120 to obtain the stack 1520 with the high resistance region can use techniques previously described with respect to the high resistance region 600. Thus, the formation of the high resistance region in stack 1520 is not limited to the embodiment as illustrated in FIG. 17.

The composition of the material 1740 may depend on whether the material 1740 is removed after formation of the high resistance region in the stack 1520. For example, a polyimide tape, such as Kapton®-brand tape (commercially available from E.I. DuPont de Nemours & Co., Wilmington, Del., USA) has an amber color. Due to the color, such a tape may be removed if the tape significantly encroaches into the field of view for the electrochromic device (for example, extends more than 1 cm from the bus bar closer to the tape). Other compositions may not be as visible as polyimide. For example, an acrylic compound, such as poly-(methyl methacrylate), is clear and may be retained over the substrate 100 and not removed. Alternatively, the acrylic compound or other polymer layer may be removed. When the material 1740 is in the form of a tape, it may be peeled off after forming the high resistance region. If the material 1740 is coated, it may remain or be removed by a solvent or ashing.

In a further embodiment, the material 1740 may be used in conjunction with the previously described embodiments with respect to applying pressure. The material 1740 can help to reduce damage or contamination of the stack when applying pressure.

In a particular embodiment, formation of the high resistance region may be deferred until after the substrate 100 is cut into individual pieces. For example, all operations other than forming the high resistance region may be performed. The portion of the substrate 100 corresponding to region 204 may be attached to the material 1740, which can be in the form of a counter substrate. The counter substrate can be any of materials as previously described with respect to the substrate 100 or the outer substrate 1420. After forming the high resistance region within the stack 1520, the counter substrate may remain attached to the stack 1520, and the counter substrate can be the outer substrate 1420 or otherwise used in a finished product, or the counter substrate may be removed.

3. Thermal Gradient and the High Resistance Region

Figure 18:
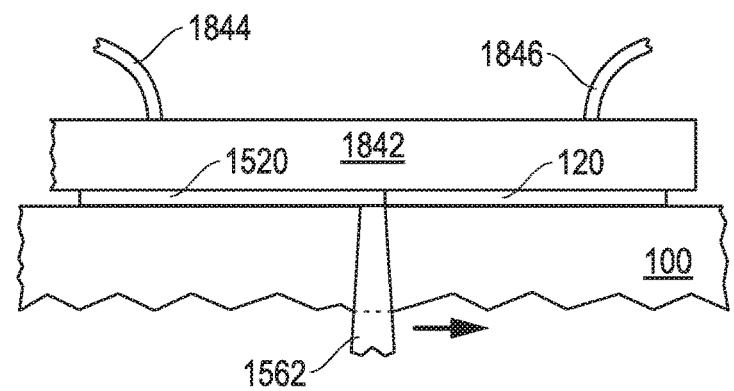
FIG. 18 includes an illustration of a cross-sectional view of the workpiece of FIG. 1 after forming a high resistance region in accordance with a further alternative embodiment.

A thermal gradient may be used in conjunction with forming a high resistance region within the stack 120 to obtain the stack 1520. FIG. 18 includes a temperature-altering mechanism 1842 that is thermally conductive and in contact with the stack. The temperature-altering mechanism 1842 may optionally include lines 1844 and 1846 coupled to it. In an embodiment, the temperature-altering mechanism 1842 may include a heat sink, and the lines 1844 and 1846 can include cooling fluid lines coupled to the heat sink. In another embodiment, the cooling lines may not be coupled to the heat sink or may be inactive when the heat sink is in contact with the high resistance region. In a further embodiment, the temperature-altering mechanism 1842 can include a heater, and the lines 1844 and 1846 may include wires and allow electrical current to flow through the heater. In another embodiment, a cooling or heating fluid may be directed at the surface of the stack without a heat sink or a heater. For example, the fluid may include heated or cooled dry air, $N_2$, or a supercritical fluid, such as $CO_2$, and flow over the surface of the stack. The temperature of that stack may be modified by the temperature-altering mechanism 1842 or fluid before, during, or after the formation of the high resistance region. In another embodiment, no lines may be connected to the temperature-altering mechanism 1842. The temperature-altering mechanism 1842 may have a sufficient mass to help keep the temperature relatively constant when the high resistance region is being formed. In a particular embodiment, the temperature-altering mechanism 1842 may have fins (not illustrated) to aid in transferring thermal energy to or from the workpiece when the high resistance region is formed.

4. Other Alternatives

The methods for forming the high resistance region within the stack is not limited to the embodiments described herein. According other methods of variants of the methods disclosed herein are non-limiting, exemplary embodiments.

5. Formation of the High Resistance Region and Holes

The process for forming a high resistance region within the stack 120 to obtain the stack with the high resistance region can use some or all of the techniques previously described with respect to the high resistance region 600. The holes 300 may or may not be formed in the embodiments as described or illustrated in the alternative embodiments. Thus, the formation of the high resistance region in stack is not limited to the embodiments as illustrated in FIGS. 15 to 18.

6. Another (Counter) Substrate

Figure 19:
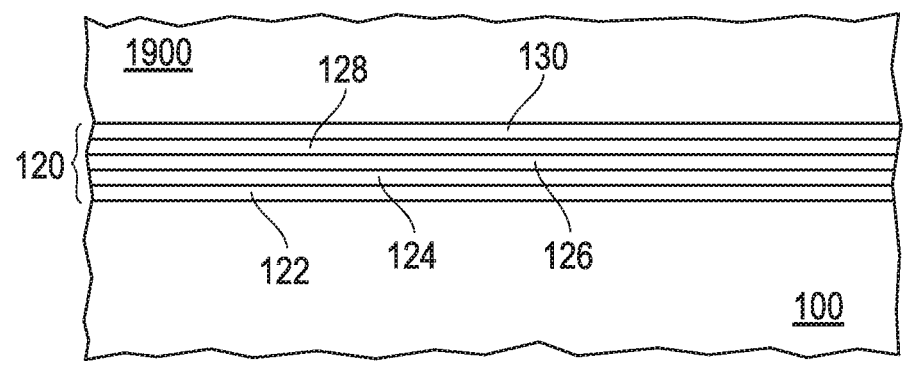
FIG. 19 includes an illustration of a cross-sectional view of a stack of layers disposed between substrates.

Referring to FIG. 19, another substrate 1900 may be laminated or otherwise attached to the substrate 100, the stack 120, or both before or after forming the high resistance region 600 in the lower transparent conductor layer 122 or before or after forming a high resistance region in the upper transparent conductive layer 130 at a location similar to the opening 942 as illustrated in FIGS. 9 to 13. The other substrate 1900 can be a counter substrate and thicker than the substrate 100. In a particular embodiment, the other substrate 1900 can have any of the compositions as described with respect to the substrate 100. The other substrate 1900 may have the same or different composition as compared to the substrate 100. The substrate 1900 may or may not be heat tempered or chemically tempered or strengthened. In a particular embodiment, the substrate can have a thickness in a range of 2 mm to 9 mm, although thicknesses outside this range may be used.

Similar to the previously described embodiments, electromagnetic radiation can be directed through the other substrate 1900 to affect one or more layers within the stack 120. The exposure to electromagnetic radiation through the other substrate 1900 may be performed instead of or in conjunction with the other operations previously described. For example, the openings 922 and 930 may be defined, and the bus bars 1122 and 1130 may be formed before forming the high resistance region using the lower transparent conductive layer 122 and a high resistance region (corresponding to the location of the opening 942 in FIGS. 9 to 13) using the upper transparent conductive layer 130. Either or both high resistance regions may be formed by directing a laser beam through the other substrate 1900. The considerations previously described with respect to forming high resistance regions when directing a laser beam though the substrate 100 can be relevant when a laser beam is directed through the other substrate 1900. Holes 300 may or may not be used in this embodiment, and may be formed before or after the laminate is formed.

7. Other Spacings Between a High Resistance Region and Bus Bars

Figure 20:
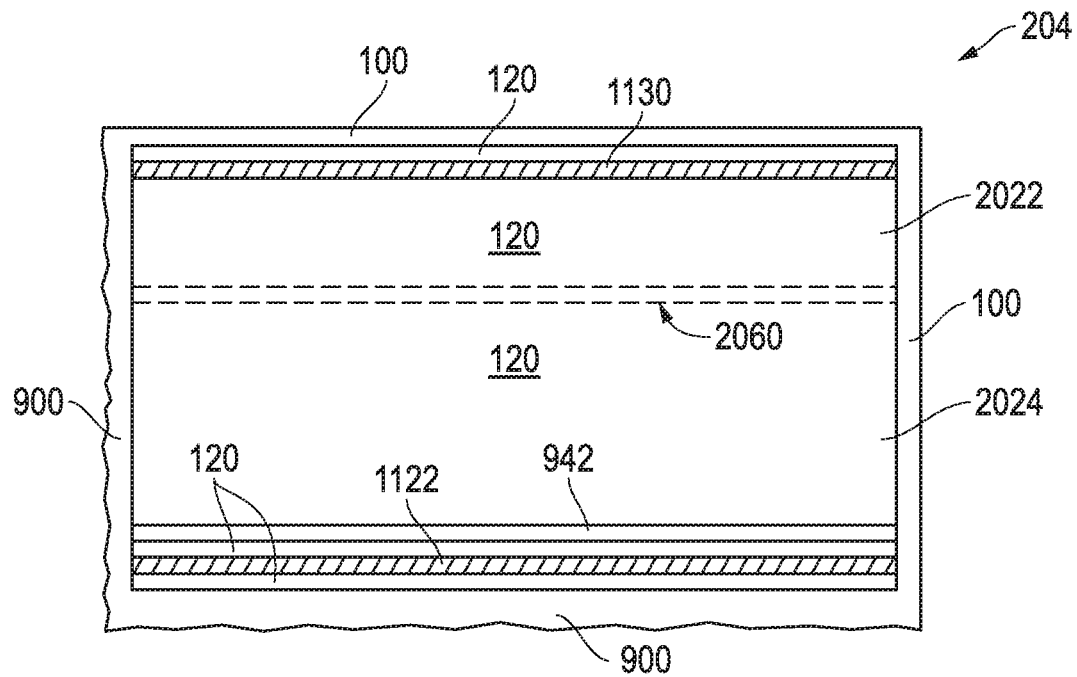
FIG. 20 includes an illustration of a top view of a workpiece in which a high resistance region is spaced apart from bus bars.

A high resistance region can be formed spaced apart further from the bus bars as compare to what is previously disclosed. In an embodiment, a panel may be formed so that a portion can allow a broader spectrum of visible light to pass and another portion may have its transmission varied. Such an embodiment may be useful for maintaining better color balance within a room or other controlled space. Referring to FIG. 20, a high resistance region 2060 can be formed significantly closer to the middle of the panel corresponding to the region 204, as compared to the high resistance region 600. The high resistance region 2060 can be formed using many of the previously described techniques for forming the high resistance regions 600 and 1520. As illustrated in FIG. 20, the portion 2022 of the stack 120, closer to the top of the illustration, will have the transparent conductive layers 122 and 130 electrically shorted to each other, and therefore, the portion 2022 can remain in its higher transmission (bleached) state. The portion 2024 of the stack 120, closer to the bottom of the illustration, can have its transmission to visible light varied. When the portion 2024 of the stack 120 is in a lower transmission state (tinted), blue light can pass through such portion; however other colors may have a lower transmission through the portion 2024. The portion 2022 of the stack 120 can help to provide a wider spectrum of light so that objects within the room or other controlled space do not appear to be quite so blue.

Other configurations may be used. For example, the panel corresponding to the region 204 may be used for a windshield. The portion 2022 of the stack 120 may have variable transmission, and the portion 2024 of the stack 120 may have its transparent conductive layers 122 and 130 electrically shorted to each other and remain in its higher transmission (bleached) state.

The location of the high resistance region 2060 may depend on the application. In an embodiment, the high resistance region 2060 can spaced apart by at least 3 cm, at least 5 cm, or at least 11 cm from each of the bus bars 1122 and 1130.

8. Other Patterns for a High Resistance Region

Figure 21:
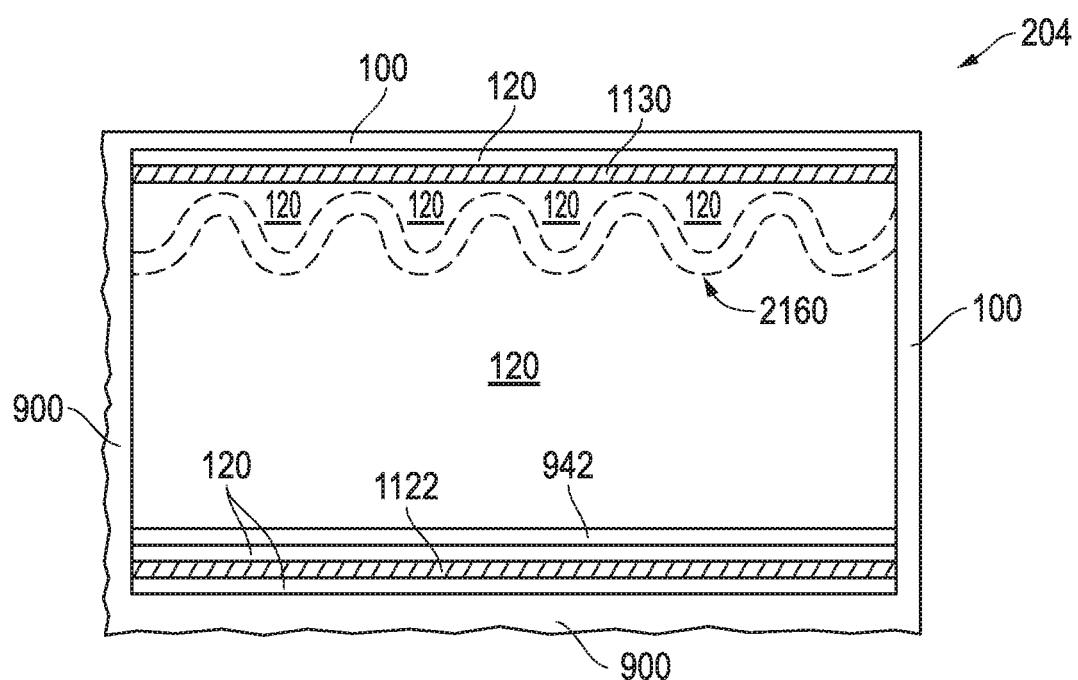
FIG. 21 includes an illustration of a top view of a workpiece including a high resistance region having a serpentine pattern.

The high resistance region may have many different shapes. FIG. 21 includes an illustration in which a high resistance region 2160 has a serpentine pattern. The high resistance region may have another shape, such as a sawtooth pattern, a zig-zig pattern, a square-wave pattern, or another pattern. Thus, the pattern can be tailored for a particular application or provide a particular appearance.

E. Benefits

Embodiments can provide benefits as compared to conventional designs and processes for electrochromic devices. A stack of layers can be deposited over a substrate before any layer within the stack is patterned. Combinations of substrates and stacks can be made and stored for an extended period, such as more than a week or a month, or shipped to a remote location before further manufacturing occurs. By delaying irreversible patterning until the closer to the date final product will be shipped to a customer, the likelihood of having too much inventory of a particular size or having to scrap windows for a custom order that was cancelled after manufacturing started can be substantially reduced. Further, the likelihood of introducing particles between the layers of the stack can be substantially reduced because no lower layer within the stack needs to be patterned before forming depositing subsequent layers.

The process flows described above are flexible, and many of the patterning operations in forming holes, openings, or the high resistance region can be performed in many different orders. Furthermore, many different techniques to pattern the lower conductive transparent layer, which is a buried layer at the time the high resistance region is formed, are disclosed. Thus, skilled artisans can select a particular technique that best suited the needs or desired for a particular application.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1

An electrical device includes: a first substrate; a first transparent conductive layer; a second transparent conductive layer, wherein the first transparent conductive layer is disposed between the first substrate and second conductive transparent layer; a first bus bar electrically connected to the first transparent conductive layer; and a second bus bar electrically connected to the second transparent conductive layer, wherein the first transparent conductive layer includes a first high resistance region, such that the first and second bus bars are not electrically connected to each other, and the electrical device has a feature including: from a top view, the first high resistance region is spaced apart from the first and second bus bars; the first bus bar has a length, and the first high resistance region has a length that is at least 2% of the length of the first bus bar; or any combination thereof.

Embodiment 2

The electrical device of Embodiment 1, wherein the lengths of the first bus bar and the first high resistance region are substantially parallel to each other.

Embodiment 3

The electrical device of Embodiment 2, wherein the length of the first high resistance region is at least 50%, at least 80%, or at least 95% of the length of the first bus bar.

Embodiment 4

An electrical device includes: a first substrate; a first transparent conductive layer; and a second transparent conductive layer, wherein the first transparent conductive layer is disposed between the first substrate and the second transparent conductive layer, wherein: the first transparent conductive layer includes a first high resistance region; and a first hole extends through at least the second transparent conductive layer, and from a top view, the first hole extends to the first high resistance region.

Embodiment 5

An electrical device includes: a first substrate; a first transparent conductive layer including a first high resistance region; and a strip of material, wherein the first high resistance region is disposed between the first substrate and the strip of material.

Embodiment 6

The electrical device of any one of Embodiments 1 to 5, further including an electrochromic device including: a first electrode layer disposed between the first transparent conductive layer and the second transparent conductive layer, wherein the first electrode layer is one of an electrochromic layer and an ion storage layer; and a second electrode layer disposed between the first electrode layer and the second transparent conductive layer, wherein the second electrode layer is the other of the electrochromic layer and the ion storage layer.

Embodiment 7

An electrical device includes: a first substrate; a first transparent conductive layer; an electrochromic device including: a first electrode layer that is one of an electrochromic layer and an ion storage layer; and a second electrode layer that is the other of the electrochromic layer and the ion storage layer; and a second transparent conductive layer, wherein: the first transparent conductive layer is disposed between the first substrate and the electrochromic device and is closer to the first electrode layer than to the second electrode layer; the electrochromic device is disposed between the first and second transparent conductive layers; the second transparent conductive layer is closer to the second electrode layer than to the first electrode layer; an intermixed region includes a mixture of materials from the first transparent conductive layer and the first electrode layer; and the second transparent conductive layer includes a portion that is intact and over or under the intermixed region.

Embodiment 8

The electrical device of Embodiment 7, wherein the intermixed region is at least part of a first high resistance region.

Embodiment 9

A process of forming a first electrical device and a second electrical device includes: providing a first substrate and a stack of layers adjacent to the first substrate, wherein the stack of layers includes: a first transparent conductive layer; a first electrode layer that is one of an electrochromic layer and an ion storage layer; a second electrode layer that is the other of the electrochromic layer and the ion storage layer; and a second transparent conductive layer, wherein the first electrode layer is disposed between the first and second transparent conductive layers, and the second electrode layer is disposed between the first electrode layer and the second transparent conductive layer; determining a first layout for the first electrical device; converting a first portion of the first transparent conductive layer to a first high resistance region within the first layout for the first electrical device after determining the first layout; determining a second layout for the second electrical device; and converting a second portion of the first transparent conductive layer to a second high resistance region within the second layout for the second electrical device after determining the second layout.

Embodiment 10

The process of Embodiment 9, further including cutting the first substrate into the first electrical device and the second electrical device.

Embodiment 11

The process of Embodiment 9 or 10, wherein the first layout is different from the second layout.

Embodiment 12

The process of any one of Embodiments 9 to 11, wherein providing the first substrate and the stack of layers includes: forming the first transparent conductive layer overlying the first substrate; forming the first electrode layer overlying the first transparent conductive layer; forming the second electrode layer overlying the first electrode layer; and forming the second transparent conductive layer overlying the second electrode layer.

Embodiment 13

The process of Embodiment 12, wherein forming the first transparent conductive layer, forming the first electrode layer, forming the second electrode layer, and forming the second transparent conductive layer are performed before patterning any of the first transparent conductive layer, the first electrode layer, the second electrode layer, and the second transparent conductive layer.

Embodiment 14

The process of any one of Embodiments 12 or 13, wherein determining the first layout for the first electrical device, determining the second layout for the second electrical device, or determine the first and second layers for the first and second electrical devices is performed after forming the first transparent conductive layer and the first electrode layer.

Embodiment 15

The process of any one of Embodiments 12 to 14, further including transporting the first substrate from a first facility to a second facility after forming the first transparent conductive layer, the first electrode layer, the second electrode layer, and the second transparent layer and before: converting the first portion of the first transparent conductive layer to the first high resistance region; converting the second portion of the first transparent conductive layer to the second high resistance region; or converting either of the first portion or the second portion of the first transparent conductive layer.

Embodiment 16

A process of forming an electrical device includes: providing a first substrate and a stack of layers adjacent to the first substrate, wherein the stack of layers includes: a first transparent conductive layer; a first electrode layer that is one of an electrochromic layer and an ion storage layer; a second electrode layer that is the other of the electrochromic layer and the ion storage layer; and a second transparent conductive layer, wherein the first electrode layer is disposed between the first and second transparent conductive layers, and the second electrode layer is disposed between the first electrode layer and the second transparent conductive layer; applying pressure on the stack; and converting a portion of the first transparent conductive layer to a first high resistance region during applying pressure on the electrochromic stack.

Embodiment 17

The process of Embodiment 16, wherein applying pressure is performed such that the stack is not substantially damaged by the application of the pressure.

Embodiment 18

A process of forming an electrical device including: providing a first substrate and a stack of layers adjacent to the first substrate, wherein the stack of layers includes: a first transparent conductive layer; a first electrode layer that is one of an electrochromic layer and an ion storage layer; a second electrode layer that is the other of the electrochromic layer and the ion storage layer a second transparent conductive layer, wherein the first electrode layer is disposed between the first and second transparent conductive layers, and the second electrode layer is disposed between the first electrode layer and the second transparent conductive layer; along a side of the stack, changing a thermal gradient of at least a portion of the stack; and along an opposite side of the stack, converting a portion of the first transparent conductive layer to a first high resistance region during or after changing a thermal gradient of at least a portion the stack.

Embodiment 19

The process of Embodiment 18, wherein changing the thermal gradient includes directing a cooling fluid along the side of the stack closer to the second transparent conductive layer.

Embodiment 20

The process of Embodiment 18, wherein changing the thermal gradient includes placing a thermal conductor along the side of the stack closer to the second transparent conductive layer.

Embodiment 21

A process of forming an electrical device includes: providing a first substrate and a stack of layers adjacent to the first substrate, wherein the stack of layers includes: a first transparent conductive layer; a first electrode layer that is one of an electrochromic layer and an ion storage layer; a second electrode layer that is the other of the electrochromic layer and the ion storage layer; and a second transparent conductive layer, wherein the first electrode layer is disposed between the first and second transparent conductive layers, and the second electrode layer is disposed between the first electrode layer and the second transparent conductive layer; patterning the stack to define a first hole extending through at least the second transparent conductive layer; and converting a portion of the first transparent conductive layer to a first high resistance region after patterning the stack to define the first hole.

Embodiment 22

The process of Embodiment 21, wherein patterning the stack is performed using a first laser.

Embodiment 23

The process of Embodiment 22, wherein converting the portion of the first transparent conductive layer is performed using a second laser that passes over or under the first hole.

Embodiment 24

The process of Embodiment 21, wherein patterning the stack is performed at a first laser energy density, and converting the portion of the first transparent conductive layer is performed at a second laser energy density that is less than the first laser energy density.

Embodiment 25

The process of Embodiment 21, wherein patterning the stack is performed using a stamp.

Embodiment 26

The process of any one of Embodiments 9 to 25, further including placing a strip of material over the stack before converting the portion of the first transparent conductive layer to the first high resistance region.

Embodiment 27

The process of Embodiment 26, further including removing the strip of material from the stack after converting the portion of the first transparent conductive layer.

Embodiment 28

The process of any one of Embodiments 9 to 27, further including forming a laminate including the first substrate, a second substrate, and the stack of layers disposed between the first and second substrates.

Embodiment 29

The process of Embodiment 28, wherein converting the portion of the first transparent conductive layer to the first high resistance region is performed by introducing energy through the second substrate.

Embodiment 30

The process of Embodiment 28 or 29, further including converting a portion of the second transparent conductive layer to another high resistance region within the second transparent conductive region.

Embodiment 31

The process of Embodiment 30, wherein converting a portion of the second transparent conductive layer to another high resistance region is performed by introducing energy through the second substrate.

Embodiment 32

The electrical device or the process of any one of Embodiments 1 to 3, and 5 to 31, wherein a first hole extends through the second transparent conductive layer, and from a top view, the first hole overlies or underlies the first high resistance region.

Embodiment 33

The electrical device or the process of any one of Embodiments 1 to 32, wherein: the second transparent conductive layer has a pattern that defines a first bus bar opening and a second bus bar opening, wherein the first transparent conductive layer is exposed within the first and second bus bar openings; the first bus bar contacts the first transparent conductive layer within the first bus bar opening; and the second bus bar contacts the first transparent conductive layer within the second bus bar opening.

Embodiment 34

The electrical device of the process of Embodiment 33, wherein first bus bar contacts a portion of the first transparent conductive layer along a side of the first high resistance region, and the second bus bar contacts a second portion of the first transparent conductive layer along an opposite side of the first high resistance region.

Embodiment 35

The electrical device or the process of any one of Embodiments 4, 6, and 21 to 34, wherein: a second hole is spaced apart from the first hole by a space, extends through at least the second transparent conductive layer, and from a top view, the second hole overlies or underlies the first high resistance region; a void corresponds to a particular portion of the first transparent conductive layer, the first electrode layer, or both removed from the space between the first and second holes; and a portion of the second transparent conductive layer, the second electrode layer, or both are within the space and above the void.

Embodiment 36

The electrical device of the process of any one of Embodiments 4, 6, and 21 to 35, wherein the first hole has a width of at most 900 microns or at most 50 microns.

Embodiment 37

The electrical device of the process of any one of Embodiments 4, 6, and 21 to 36, wherein the electrical device includes a set of holes, including the first hole, that extend through at least the second transparent conductive layer.

Embodiment 38

The electrical device of the process of Embodiment 37, wherein at least 90% of the holes within the set of hole have widths of at most 900 microns or at most 50 microns.

Embodiment 39

The electrical device of the process of Embodiment 37 or 38, wherein from a top view, the set of holes are oriented along a line, and the first high resistance region has a length that extends along the line.

Embodiment 40

The electrical device of the process of any one of Embodiments 37 to 39, wherein within the set of holes, immediately adjacent holes are separated by distances, and 90% of the distances are at most three times the average width of the set of holes or at most two times the average width of the set of holes.

Embodiment 41

The electrical device of the process of any one of Embodiments 1 to 40, wherein the electrical device includes an inorganic solid state electrochromic device.

Embodiment 42

The electrical device of the process of any one of Embodiments 1 to 41, further including an ion conductive layer disposed between the first electrode layer and the second electrode layer, wherein the ion conductive layer includes an inorganic material.

Embodiment 43

The electrical device of the process of any one of Embodiments 1 to 27 and 32 to 42, further including a second substrate closer to the second transparent conductive layer than the first conductive layer, and the first substrate is closer to the first transparent conductive layer than the second conductive layer.

Embodiment 44

The electrical device of the process of any one of Embodiments 28 to 31 and 43, wherein the second substrate is thicker than the first substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electrical device comprising:
    a first substrate;
    a first transparent conductive layer; and
    a second transparent conductive layer, wherein the first transparent conductive layer is disposed between the first substrate and the second transparent conductive layer,
    wherein:
        the first transparent conductive layer includes a first high resistance region; and
        a first hole extends through at least the second transparent conductive layer, and from a top view, the first hole extends to the first high resistance region.

2. The electrical device of claim 1, further comprising:
    an electrochromic device including:
        a first electrode layer that is one of an electrochromic layer and an ion storage layer; and
        a second electrode layer that is the other of the electrochromic layer and the ion storage layer,
    wherein:
        the first transparent conductive layer is disposed between the first substrate and the electrochromic device and is closer to the first electrode layer than to the second electrode layer;
        the electrochromic device is disposed between the first and second transparent conductive layers;
        the second transparent conductive layer is closer to the second electrode layer than to the first electrode layer;
        an intermixed region includes a mixture of materials from the first transparent conductive layer and the first electrode layer; and
        the second transparent conductive layer includes a portion that is intact and over or under the intermixed region.

3. The electrical device of claim 2, wherein the intermixed region is at least part of the first high resistance region.

4. The electrical device of claim 1, further comprising:
    a first substrate;
    a first transparent conductive layer;
    an electrochromic device including:
        a first electrode layer that is one of an electrochromic layer and an ion storage layer; and
        a second electrode layer that is the other of the electrochromic layer and the ion storage layer; and
    a second transparent conductive layer, wherein the first transparent conductive layer is disposed between the first substrate and second conductive transparent layer;
    a first bus bar electrically connected to the first transparent conductive layer; and
    a second bus bar electrically connected to the second transparent conductive layer, wherein:
        (1) the first transparent conductive layer includes a first high resistance region, such that the first and second bus bars are not electrically connected to each other, and the electrical device has a feature including:
            from a top view, the first high resistance region is spaced apart from the first and second bus bars;
            the first bus bar has a length, and the first high resistance region has a length that is at least 2% of the length of the first bus bar; or
            any combination thereof; and
        (2) the electrical device further comprises a strip of material, wherein the first high resistance region is disposed between the first substrate and the strip of material.

5. The electrical device of claim 4, wherein:
    a second hole is spaced apart from the first hole by a space, extends through at least the second transparent conductive layer, and from a top view, the second hole overlies or underlies the first high resistance region;
    a void corresponds to a particular portion of the first transparent conductive layer, the first electrode layer, or both removed from the space between the first and second holes; and
    a portion of the second transparent conductive layer, the second electrode layer, or both are within the space and above the void.

6. The electrical device of claim 5, wherein the first hole has a width of at most 900 microns or at most 50 microns.

7. An electrical device comprising:
    a first substrate;
    a first transparent conductive layer including a first high resistance region;
    a first electrode layer;
    a second transparent conductive layer;
    a second electrode layer; and
    an intermixed region including a mixture of materials from the first transparent conductive layer and the first electrode layer;
    wherein the first transparent conductive layer is disposed between the first substrate and the second transparent conductive layer;
    wherein the first electrode layer is between the first transparent conductive layer and the second transparent conductive layer;
    wherein the first electrode layer is one of an electrochromic layer and an ion storage layer;
    wherein the second electrode layer is disposed between the first electrode layer and the second transparent conductive layer; and
    wherein the second electrode layer is the other of the electrochromic layer and the ion storage layer.

8. The electrical device of claim 7, further comprising a strip of material, wherein the first high resistance region is disposed between the first substrate and the strip of material.

9. The electrical device of claim 7, wherein the second transparent conductive layer includes a portion that is intact and over or under the intermixed region.

10. The electrical device of claim 7, wherein the intermixed region is at least part of a first high resistance region.

11. The electrical device of claim 7, further comprising a first hole extending through at least the second transparent conductive layer, and from a top view, the first hole extends to the first high resistance region.

12. A process of forming an electrical device comprising:
    providing a first substrate and a stack of layers adjacent to the first substrate, wherein the stack of layers includes:
        a first transparent conductive layer;
        a first electrode layer that is one of an electrochromic layer and an ion storage layer;
        a second electrode layer that is the other of the electrochromic layer and the ion storage layer; and
        a second transparent conductive layer,
        wherein the first electrode layer is disposed between the first and second transparent conductive layers, and the second electrode layer is disposed between the first electrode layer and the second transparent conductive layer;
    patterning the stack to define a first hole extending through at least the second transparent conductive layer; and converting a portion of the first transparent conductive layer to a first high resistance region after patterning the stack to define the first hole.

13. The process of claim 12, wherein converting the portion of the first transparent conductive layer to the first high resistance region comprises:
applying pressure on the stack to convert the portion of the first transparent conductive layer to a first high resistance region.

14. The process of claim 12, wherein converting the portion of the first transparent conductive layer to the first high resistance region comprises:
along a side of the stack, changing a thermal gradient of at least a portion of the stack; and
along an opposite side of the stack, converting the portion of the first transparent conductive layer to the first high resistance region during or after changing the thermal gradient of the at least a portion the stack.

15. The process of claim 12, further comprising forming a laminate comprising the first substrate, a second substrate, and the stack of layers disposed between the first and second substrates, wherein converting the portion of the first transparent conductive layer to the first high resistance region is performed by introducing energy through the second substrate.

16. The process of claim 12, wherein converting the portion of the first transparent conductive layer is performed using a first laser that passes over or under the first hole.

17. The process of claim 16, wherein patterning the stack is performed using a second laser.

18. The process of claim 17, wherein converting the portion of the first transparent conductive layer is performed at a first laser energy density, and patterning the stack is performed at a second laser energy density that is greater than the first laser energy density.

19. The process of claim 12, further comprising:
determining a first layout for the first electrical device;
converting a first portion of the first transparent conductive layer to a first high resistance region within the first layout for the first electrical device after determining the first layout;
determining a second layout for the second electrical device; and
converting a second portion of the first transparent conductive layer to a second high resistance region within the second layout for the second electrical device after determining the second layout.

* * * * *

UNITED STATES PATENT AND TRADEMARK OFFICE
CERTIFICATE OF CORRECTION

PATENT NO. : 10,509,291 B2
APPLICATION NO. : 15/905175
DATED : December 17, 2019
INVENTOR(S) : Sebastian Marius Sarrach et al.

It is certified that error appears in the above-identified patent and that said Letters Patent is hereby corrected as shown below:

In the Specification

Column 4, Line 35, delete "$CO_2O_3$" and insert --$Co_2O_3$--

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*